United States Patent [19]

Ueno

[11] Patent Number: 5,086,007
[45] Date of Patent: Feb. 4, 1992

[54] METHOD OF MANUFACTURING AN INSULATED GATE FIELD EFFECT TRANSISTOR

[75] Inventor: Katunori Ueno, Kanagawa, Japan
[73] Assignee: Fuji Electric Co., Ltd., Japan
[21] Appl. No.: 521,230
[22] Filed: May 8, 1990

[30] Foreign Application Priority Data

May 24, 1989 [JP] Japan ................... 1-131085

[51] Int. Cl.[5] ................... H01L 21/225; H01L 21/336
[52] U.S. Cl. ........................ 437/41; 437/67;
437/153; 437/164; 437/203; 148/DIG. 126
[58] Field of Search ............ 437/203, 67, 78, 151,
437/152, 153, 154, 164, 40, 41, 162, 911;
357/23.4; 148/DIG. 126

[56] References Cited

U.S. PATENT DOCUMENTS

| 3,685,140 | 8/1972 | Engeler | 437/157 |
| 4,370,180 | 1/1983 | Azuma et al. | 437/203 |
| 4,520,552 | 6/1985 | Arnould et al. | 437/67 |
| 4,853,345 | 8/1989 | Himelick | 437/153 |

FOREIGN PATENT DOCUMENTS 58-61673 4/1983 Japan ................... 357/23.4

OTHER PUBLICATIONS

Ueda, D., et al., "An Ultra-Low Oh-Resistance..." IEEE Trans. Electron Devices, vol. ED-34, No. 4, Apr. 1987, pp. 926-930.

Primary Examiner—Brian E. Hearn
Assistant Examiner—T. N. Quach
Attorney, Agent, or Firm—Brumbaugh, Graves, Donohue & Raymond

[57] ABSTRACT

Improved insulated gate field effect transistors and methods of manufacture are disclosed wherein a self aligned source region is formed in the sides of a groove or indentation in a semiconductor substrate. By eliminating photolithography steps, yield is improved and manufacturing cost is reduced while achieving fine tolerances. As a result, reduction in cell size of approximately a factor of 6 is possible and channel resistance is reduced, allowing for increased current capacity. Source regions (26) are formed by dopant outdiffusion from insulating portions (24C).

7 Claims, 3 Drawing Sheets

FIG. 4 (A) (PRIOR ART)
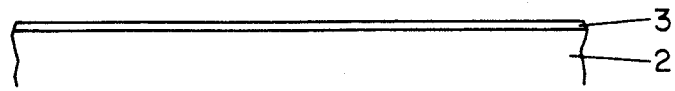
FIG. 4 (B) (PRIOR ART)
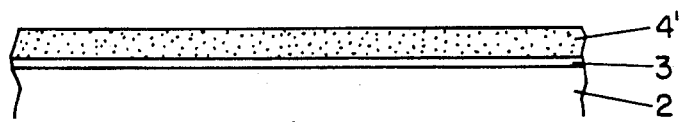
FIG. 4 (C) (PRIOR ART)
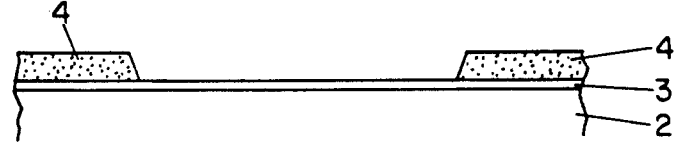
FIG. 4 (D) (PRIOR ART)
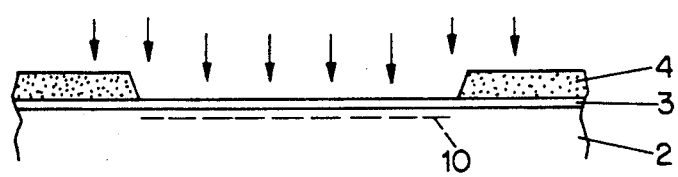
FIG. 4 (E) (PRIOR ART)
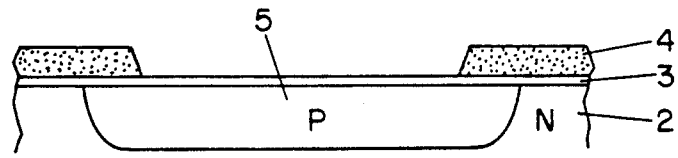
FIG. 4 (F) (PRIOR ART)
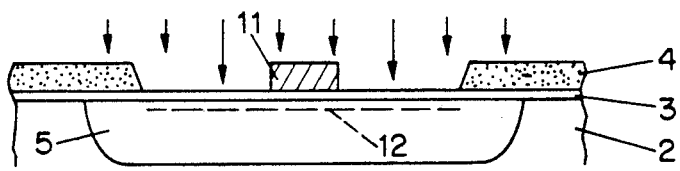
FIG. 4 (G) (PRIOR ART)
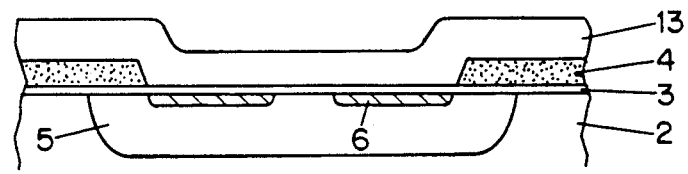
FIG. 4 (H) (PRIOR ART)
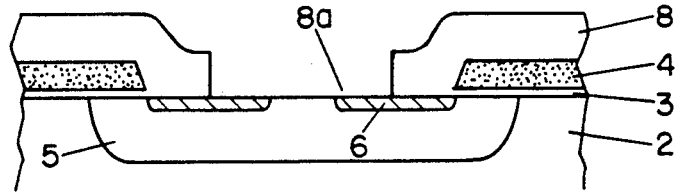
FIG. 4 (I) (PRIOR ART)
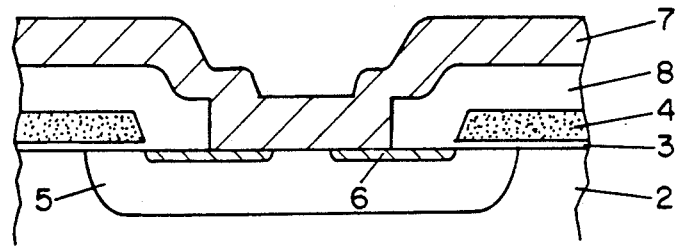

METHOD OF MANUFACTURING AN INSULATED GATE FIELD EFFECT TRANSISTOR

BACKGROUND OF THE INVENTION

The present invention relates to an insulated gate field effect transistor, such as a power MOSFET or an insulated gate bipolar transistor (hereinunder referred to as "IGBT") and, more particularly, to an insulated gate field effect transistor and method of manufacturing the same, having a semiconductor structure in which drain, gate and source regions are vertically disposed. A conventional n-channel power MOSFET has a structure such as that shown in FIG. 3. The n-channel power MOSFET in FIG. 3 contains a high-concentration n-type drain layer 1, an n-type base layer (drain and drift regions) 2 formed thereon, a polysilicon gate 4 formed on the n-type base layer with a gate oxide film 3 therebetween, a p-type base region (channel diffusion region) 5 formed by thermal diffusion with the polysilicon gate 4 used as a mask, a high-concentration n-type source region 6, a source electrode 7 which is in conductive contact with the source region 6, an interlayer insulating film 8 for insulating the source electrode 7 from the polysilicon gate 4, and a drain electrode 9 which is formed on the back surface of the substrate. In this MOSFET, electron current flows in the transverse direction from the source region 6 to the n-type base layer through a channel inversion layer formed on the surface of the p-type base 5 right under the polysilicon gate 4, and thereafter flows in a downward vertical direction toward the drain electrode.

An IGBT has the same structure as the power MOSFET shown in FIG. 3 with a high concentration p-type minority carrier (hole) injection layer located between the drain layer 1 and the drain electrode 9. The structure of the MOS portion is the same as that of the power MOSFET.

The on-resistance R of the vertical MOSFET is represented by the following formula:

$$R = R_{ch} + R_{ACC} + R_j + R_b \quad (1)$$

wherein $R_{ch}$ represents the channel resistance of the channel inversion layer of the MOS portion $R_{ACC}$ the resistance of the accumulation layer generated right under the polysilicon gate 4 except in the p-type base region 5, $R_J$ the resistance produced when electrons pass between cells, and $R_b$ the resistance of the n-type base layer 2. The resistance $R_b$ of the n-type base layer 2 is chiefly determined by the thickness, and since the thickness is substantially determined by the break down voltage planned, it is impossible to lower the resistance of the n-type base layer 2 while maintaining the breakdown voltage. Since the channel resistance $R_{ch}$ is dominant over the on-resistance R, in order to reduce the on R, it is necessary to reduce $R_{ch}$. To reduce $R_{ch}$, it is necessary to make the patterning finer so as to decrease the channel region.

The method of manufacturing the vertical power MOSFET just described will now be explained with reference to FIGS. 4(A) to 4(I). The surface of the n-type base layer 2 is first oxidized so as to form the gate oxide film 3, as shown in FIG. 4(A), and a polysilicon layer 4' is laminated on the gate oxide film 3 by CVD or the like, as shown in FIG. 4(B). After the polysilicon gate 4 is formed by patterning and etching, as shown in FIG. 4(C), impurities 10 which are to constitute the p-type base region are introduced by ion implantation or the like, as shown in FIG. 4(D), and the p-type base region 5 shown in FIG. 4(E), is formed by thermal diffusion of the impurities 10. A photoresist 11 for selecting and introducing impurities 11 is deposited at the central portion of the opening and impurities 12 are introduced by ion implantation, as shown in FIG. 4(F). The photoresist 11 is then removed and an insulating film 13 is laminated on the exposed surface, as shown in FIG. 4(G). The opening portion 8a extending over two adjacent source regions 6 is then patterned and aluminum or the like is deposited by sputtering or the like to form the source electrode 7 shown in FIG. 4(I).

An insulated gate field effect transistor having the above-described MOS structure has the following problems.

Referring to FIG. 3 the distance a between two adjacent polysilicon gates 4 is about 10 $\mu$m at a minimum. Finer fabrication, which would reduce this distance a, is technically difficult because several regions are formed by a plurality of photolithography steps. Within the planar distance a, formation of the source regions 6 (FIG. 4 (F)–(G)) and patterning of the insulating film 8 must take place (FIG. 4 (H)). these steps must be carried out such that the source electrode 7, formed in 4(I), will be in contact with the source region 6. An additional requirement is that the source region 6 not contact the gate region 4. If the patterning dimension of the insulating film 8 is too small, the contact resistance increases and contact between the source region 6 and source electrode 7 may become impossible. In addition, if a is shortened too much and the difference between the a and the patterning dimension of the insulating film 8 is reduced, the source region 6 may be brought into contact with the gate region 4 by inaccurate patterning, side etching of the insulating film 8 or the like. Therefore with the prior technology, it was impossible to greatly reduce channel resistance without the great possibility of producing a defective device.

Accordingly, it is an object of the present invention to eliminate the above-described problems in the prior art and to provide an insulated gate field effect transistor, with greatly reduced channel resistance, and a method of manufacturing the same. Finer patterning is facilitated by forming a vertically oriented MOS portion in which the source region is provided near the upper portion of the gate, through the insulating film, without providing a contact portion of the source region and the source electrode between adjacent gates.

SUMMARY OF THE INVENTION

To solve the above-described problems, according to the present invention, a gate surrounded by an insulating material is provided on a first conduction type, or conductivity type, which terms shall be used interchangeably, semiconductor layer (e.g., drain region), a second conduction type region (e.g., channel diffusion region) is provided adjacent to the periphery of the gate with the insulating layer therebetween, and a first conduction type region (e.g. source region) is provided along the side surface of the insulating material at least at the upper portion of the gate.

One method of manufacturing an insulated gate field effect transistor having the above-described structure comprises the steps of digging grooves or indentations in a first conduction type semiconductor substrate and oxidizing the surfaces of the indentations, depositing a gate material in the indentations, diffusing impurities which are to constitute a second conduction type region around the indentations, depositing an insulating material containing impurities which are to constitute a first conduction type region in the indentations and diffusing the impurities to form a first conduction type region.

An alternative method for manufacturing an insulated gate field effect transistor having the above-described structure comprises the steps of forming a second conduction type region on a first conduction type semiconductor substrate, forming indentations in the existing structure so as to be surrounded by the second conduction type region, oxidizing the surfaces of the indentations depositing a gate material and an insulating material containing impurities which are to constitute a first conduction type region in the indentations, and diffusing the impurities to form a first conduction type region. In such an insulated gate field effect transistor, first conduction type regions (e.g., source regions) are provided along the side surface of the insulating material, vertically oriented at the upper portion of the gate. Therefore, a channel inversion layer is vertically formed along the insulating layer in the direction of the thickness of the gate. Since it is unnecessary to form the source region between the gates in the direction of the depth of the substrate by diffusion, and the second conduction type region as a channel diffusion region substantially exists, finer patterning than the patterning in the prior art is easy. In addition, since it is possible to form the contact portion of the source region and the source electrode not between the gates but simply on the upper portion of the source region, finer patterning than the patterning in the prior art is realized.

In the first manufacturing method, an indentation is formed in a first conduction type semiconductor substrate and the surfaces of the indentation are oxidized, thereby forming an insulating layer, a part of which insulates a gate from the substrate. After the gate is deposited in the indentation and impurities which are to constitute a second conduction type region are diffused around the indentation so as to form the second conduction type region, an insulating material containing impurities which are to constitute a first conduction type region is deposited in the indentation and the impurities are diffused. The impurities are diffused from the side surface of the insulating material into the previously formed second conduction type region and the first conduction type region as a source region extending along the side surface of the insulating material is formed.

In the second manufacturing method, the second conduction type region is formed prior to forming the indentations step. By this method, an insulated gate field effect transistor having the above-described structure is also obtained.

In accordance with the present invention there is provided a single mask method utilizing self alignment of source regions for manufacturing insulated gate field effect transistors with reduced spacing. The method includes the steps of forming grooves or indentations in a first conduction type semiconductor substrate, providing an insulating layer on the surfaces of the indentations and depositing a gate material in the indentations. An insulating material containing first conduction type impurities is deposited in the indentations and the impurities are diffused from the insulating material into adjacent semiconductor material to form source regions. As a result, transistors may be reliably manufactured in closely spaced relationship in the absence of successive registration steps through use of self alignment to provide transistors with large current capacity, resulting from reduced channel resistance, and high density integration.

Also in accordance with the present invention there is provided an insulated gate field effect transistor comprising a first conduction type semiconductor substrate, an insulating layer on surfaces of an indentation in the semiconductor substrate and a gate material within the indentation. The transistor also includes an insulating material in the indentations, above the gate material, and another first conduction type semiconductor region adjacent to the indentations, composed of impurities diffused from the insulating material.

BRIEF DESCRIPTION OF THE DRAWINGS

FIG. 4 depicts the method of manufacturing the n-channel power MOSFET in FIG. 3.

DESCRIPTION OF THE PREFERRED EMBODIMENT

An embodiment of the present invention will be explained hereinunder with reference to the accompanying drawings.

Figure 1:
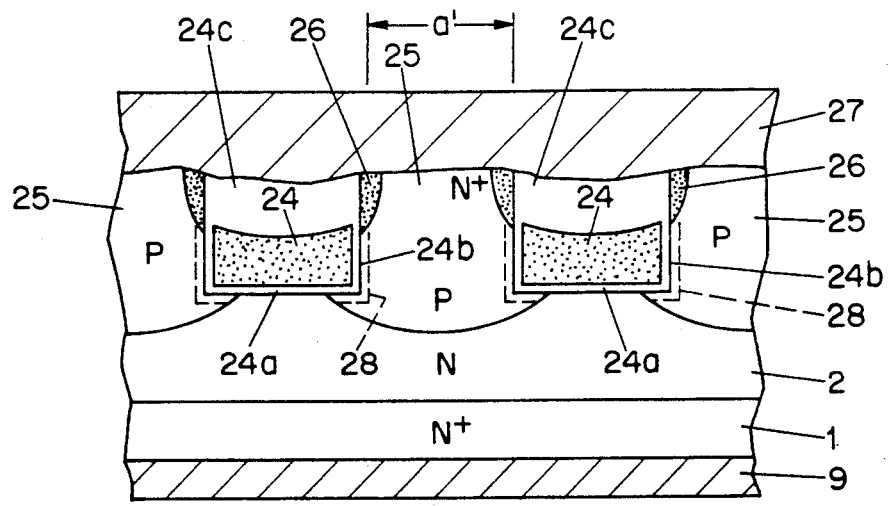
FIG. 1 is a vertical sectional view of the structure of an insulated gate field effect transistor according to the present invention.
Figure 3:
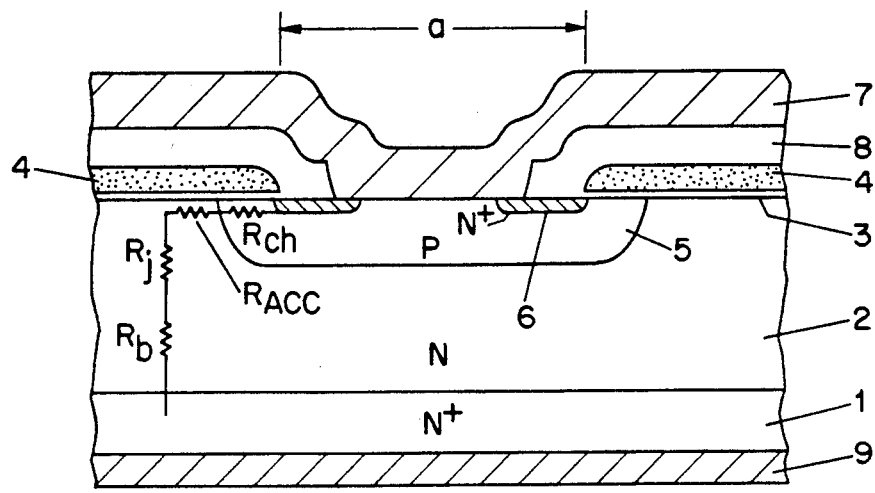
FIG. 3 is a vertical sectional view of a conventional n-channel power MOSFET.

FIG. 1 is a vertical sectional view of the structure of an embodiment of an insulated gate field effect transistor according to the present invention. In FIG. 1, the same numerals are used to label the corresponding elements shown in FIG. 3, and explanation thereof will be omitted.

In FIG. 1, the reference numeral 24 represents a polysilicon gate, and the bottom surface and the side surface thereof are surrounded by insulating layers 24a and 24b, respectively. On the upper surface of the polysilicon gate 24, a buried insulation material 24c of phosphorus glass (PSG) is laminated. Numeral 25 represents a p-type base region, as a channel diffusion region, formed between two adjacent polysilicon gates 24. The PN junction surface of the p-type base region 25 and the n-type base region 2 is situated at a position slightly closer to the drain layer 1 than to the insulating layer 24a on the bottom surface of the polysilicon gate 24. A high-concentration n-type source region 26 is formed along the side surface of the embedded insulation material 24c. The source region 26 is a thin vertically oriented region which slightly protrudes into the p-type base region 25 from the side surface of the embedded insulation layer 24c. The upper surfaces of the source region 26 and the p-type base region 25 are substantially flat, and a source electrode 27 is deposited thereon.

While the size of a cell in the prior art is about 10 to 20 μm, the size a' of a cell in this embodiment is greatly reduced to about 2 to 3 μm. This is possible because only the p-type base region 25 substantially exists between the polysilicon gates 24. Because the p-type base region 25 is a channel diffusion region in which a channel inversion layer 28 is to be formed, it is unnecessary to set the width of the p-type base region 25 so large as to secure a conventional source contact portion. In others words, the p-type base region 25 is formed without any photolithography process. The drain region 1, the gate region 24 and the source region 26 are arranged substantially in the vertical direction, and the channel inversion layer 28 is oriented vertically long along the silicon oxide film 24b on the side surface of the polysilicon gate 24. Since the length of the channel inversion layer substantially corresponds to the thickness of the polysilicon gate 24 and the thickness of the polysilicon gate 24 is relatively reduced by making the polysilicon gate 24 smaller, great reduction of the channel resistance is realized.

When this structure is applied to an IGBT, it is possible in principle to bring the contact portion of the source region 26 and the p-type base region 25 closer to the n-type base region 2 than to the source region 26, thereby suppressing the rise in the electric potential of the p-type base region which also functions as the base region of a parasitic transistor, contributing to the prevention of latchup.

In the embodiment shown in FIG. 1, the p-type base region 25 is deeper than the groove or indentation but it may rather be shallower. In the case of a power MOSFET, especially, a shallow p-type base region can reduce the effect of a junction type FET, thereby enabling the characteristics of a vertical MOSFET to be displayed more strongly.

DESCRIPTION OF EXEMPLARY METHOD

An example of a method of manufacturing a power MOSFET having the above-described structure will be explained with reference to FIGS. 2(A) to 2(I).

Figure 2A:
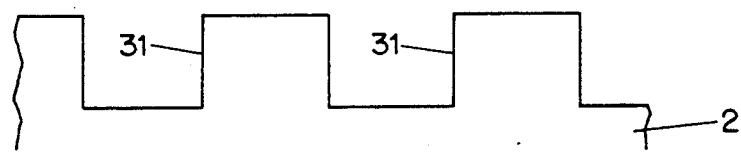
FIG. 2 (A) through (I) depicts one method to manufacture the claimed invention.
Figure 2B:
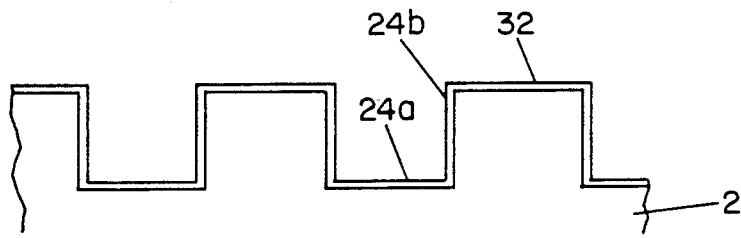
Figure 2C:
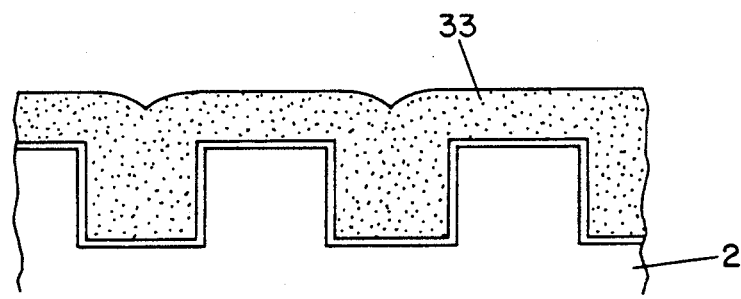
Figure 2D:
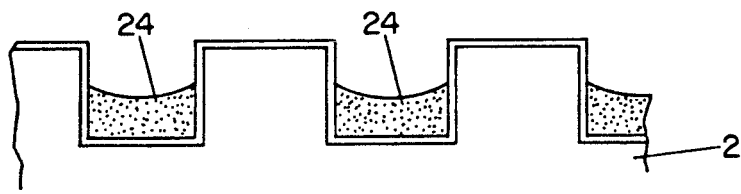
Figure 2E:
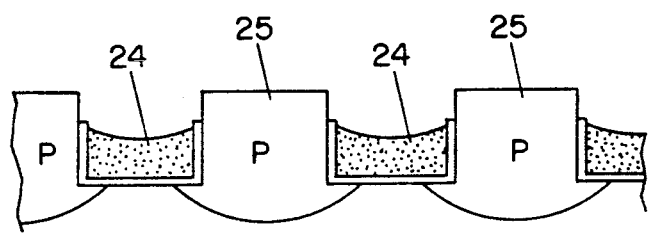
Figure 2F:
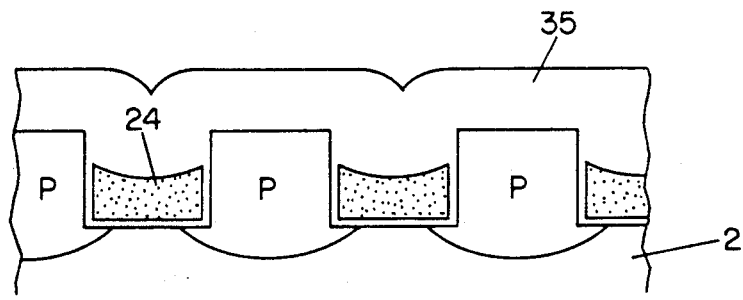
Figure 2G:
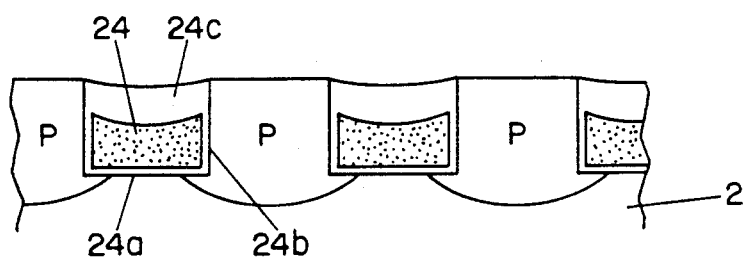
Figure 2H:
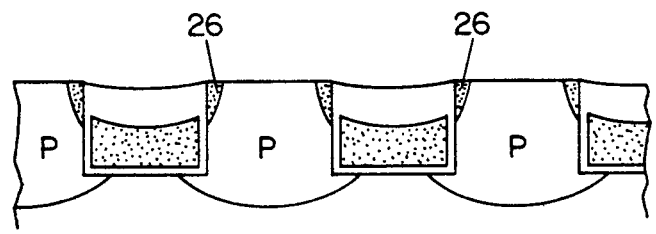
Figure 2I:
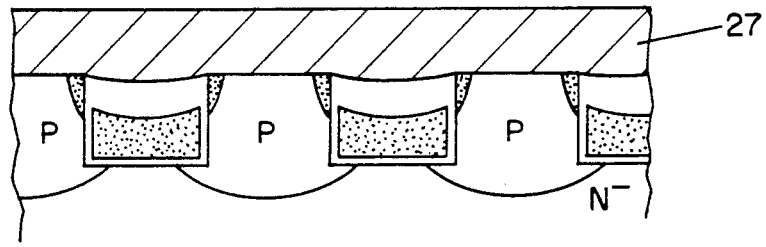

Substantially U-shaped grooves or indentations are formed in a substrate provided with the n-type base layer 2 by etching, as shown in FIG. 2(A). The surfaces of the indentations 31 are then oxidized by thermal oxidation so as to form an insulating layer shown as 32 on the surfaces, including the inner surfaces of the indentations, as shown in FIG. 2(B). The portion of the insulating layer 32, within the indentations, constitutes regions 24a and 24b (see FIG. 1). Gate material shown as polysilicon layer 33 is then deposited or laminated on the surface of the substrate by CVD, as shown in FIG. 2(C), and the upper portion of the polysilicon layer 33 is removed by total etching so as to leave only the gate material in the indentations 31, as shown in FIG. 2(D). The protruding portions of the substrate between the indentations 31 are then formed into the p-type base regions 25 by diffusing impurities, as shown in FIG. 2(E). A phosphorus glass insulating material (PSG) 35 is then deposited or laminated on the upper surface of the substrate and the indentations 31, as shown in FIG. 2(F). The upper portion of the insulating material is removed by total etching so as to embed and leave only that portion of the insulating material within the indentations 24c, as shown in FIG. 2(G). At this stage, the polysilicon gate 24 is surrounded by insulation layers 24a, 24b and the embedded insulation material 24c. Impurities in the insulation material 24c are diffused by heat treatment into the adjacent p-type base regions, thereby forming the vertically long source regions 26 along the side surface of the embedded insulation material 24c, as shown in FIG. 2(H). In FIG. 2(H), the source regions are thus formed laterally outward from the indentations 31, into the semiconductor material adjacent to the indentations as shown, by laterally diffusing impurities from the insulating material indicated as 24c in FIG. 2(G). Finally, the source electrode 27 is formed by sputtering or the like on the upper surface of the resulting structure in contact with the source regions 26, as shown in FIG. 2(I).

This manufacturing method, which enables the source regions 26 to be formed in self alignment in the absence of successive registration steps, permits fabrication of a finer and more accurate MOSFET. In spite of the reduction of the size a' of a cell to about 2 to 3 μm, since no photolithography step is included, except for forming the indentations, problems such as deviation of the mask position are not involved.

In the above manufacturing method the p-type base regions 25 are formed between the step of embedding the polysilicon gates 24 and the step of forming the embedded insulation layers 24c but an alternative method would be to form the p-type base region 25 on the entire surface of the substrate before the step of forming the indentations 31.

Although the n-channel MOSFET is cited as an example in this embodiment, a p-channel MOSFET may be produced if the respective conduction types are reversed and boron glass (BSG) is adopted as the material of the embedded insulation material at the upper portion of the gate for the formation of region 24c. Furthermore, the present invention is not restricted to a power MOSFET. It goes without saying that an IGBT possessing similar advantages can be realized by following the same procedure but additionally providing a minority carrier injection layer under the drain layer.

An insulated gate field effect transistor according to the present invention in which a first conduction type region is provided at least along the side surface of the upper portion of the insulating material which surrounds the gate, and a second conduction type region is adjacent to the periphery of the gate with the insulating layer therebetween has the following advantages:

(1) Since a source contact portion is formed on the upper surface of the source region substantially above the gate in the absence of photolithography steps, patterning much finer than in the prior art is achieved resulting in a large current capacity, by reason of a great reduction in channel resistance, and higher-density integration.

(2) Since the number of photolithography steps is reduced, yield is improved and manufacturing cost is reduced.

While there has been described what is believed to be a preferred embodiment of the present invention, those skilled in the art will recognize that modifications, to what has been specifically described, can be made without exceeding the scope of this invention which is intended to claim all such changes and modifications or the like.

I claim:

1. A single mask method utilizing self alignment of source regions for manufacturing insulated gate field effect transistors with reduced spacing comprising the steps of:
    (a) forming indentations in a first conductivity type semiconductor substrate, each such indentation representing a transistor location;
    (b) forming an insulating layer on surfaces of said indentations;
    (c) depositing gate material in said indentations;
    (d) depositing insulating material containing first conductivity type impurities in said indentations;
    (e) removing said insulating material from portions of said substrate adjacent to said indentations; and (f) laterally diffusing first conductivity type impurities from said insulating material in said indentations into adjacent semiconductor material to form source regions;

whereby transistors may be manufactured reliably in closely spaced relationship in the absence of successive registration steps through use of self alignment to provide transistors with large current capacity resulting from reduced channel resistance and high density integration.

2. The method of claim 1 additionally comprising the step of forming a second conductivity type semiconductor region adjacent to said indentations and said source regions following step (c).

3. The method of claim 1 additionally comprising the step of forming a source electrode on the surface of the structure in contact with one or more of said source regions.

4. The method of claim 1 additionally comprising the step of forming a drain electrode on the surface of said first conductivity type semiconductor substrate opposite said indentations.

5. The method of claim 1 additionally comprising the step of forming a second conductivity type semiconductor region in an area adjoining a surface of said first conductivity type semiconductor substrate prior to forming said indentations in said area.

6. The method of claim 1 additionally comprising the step of forming a minority carrier injection layer below said first conductivity type semiconductor substrate.

7. A single mask method utilizing self alignment of source regions for manufacturing insulated gate field effect transistors with reduced spacing comprising the steps of:

(a) forming indentations in an n-type semiconductor substrate, each such indentation representing a transistor location;

(b) oxidizing surfaces of said indentations by thermal oxidation so as to form a silicon oxide film on the surfaces of said indentations;

(c) depositing a polysilicon gate material in said indentations;

(d) forming a p-type base region by diffusing impurities into the region between adjacent indentations;

(e) depositing a phosphorus glass insulating material into said indentations, so as to encase said gate material;

(f) removing said phosphorus glass insulating material from portions of said substrate adjacent to said indentations;

(g) laterally diffusing impurities from said phosphorus glass insulating material in said indentations into said adjacent base region to form n-type source regions;

(h) forming source electrodes on the surface of the resulting structure, in contact with one or more of said source regions and base regions; and (i) forming a drain electrode on a surface of said substrate opposite said indentations;

whereby transistors may be manufactured reliably in closely spaced relationship with no need for registration steps, outside of electrode formation, through use of self alignment to provide transistors with large current capacity resulting from reduced channel resistance and high density integration.

* * * * *